(12) United States Patent
Choi

(10) Patent No.: US 7,892,944 B2
(45) Date of Patent: Feb. 22, 2011

(54) METHOD OF FORMING TRANSISTOR IN SEMICONDUCTOR DEVICE

(75) Inventor: Shin-Gyu Choi, Icheon-si (KR)

(73) Assignee: Hynix Semiconductor Inc., Icheon-Si, Gyeonggi-Do (KR)

( * ) Notice: Subject to any disclaimer, the term of this patent is extended or adjusted under 35 U.S.C. 154(b) by 41 days.

(21) Appl. No.: 12/344,434

(22) Filed: Dec. 26, 2008

(65) Prior Publication Data

US 2010/0055866 A1    Mar. 4, 2010

(30) Foreign Application Priority Data

Sep. 2, 2008   (KR) ...................... 10-2008-0086294

(51) Int. Cl.
   *H01L 21/762* (2006.01)
(52) U.S. Cl. ................ 438/435; 257/E21.551
(58) Field of Classification Search ............... 438/294, 438/270–272, 296, 424, 435–437; 257/E21.141, 257/E21.551
   See application file for complete search history.

(56) References Cited

U.S. PATENT DOCUMENTS 6,551,881 B1 * 4/2003 Letavic ................. 438/267

2006/0024912 A1 * 2/2006 Lee ............................ 438/424
2006/0166419 A1 * 7/2006 Shimoyama et al. ........ 438/173

FOREIGN PATENT DOCUMENTS

| KR | 1020050059750 | 6/2005 |
| KR | 10-2008-0010885 | 1/2008 |
| KR | 1020080010885 | 1/2008 |

OTHER PUBLICATIONS

Korean Office Action for application No. 10-2008-0086294, citing the attached references.

* cited by examiner

*Primary Examiner*—Matthew S Smith
*Assistant Examiner*—Daniel Shook
(74) *Attorney, Agent, or Firm*—Lowe Hauptman Ham & Berner LLP

(57) ABSTRACT

A method of forming a transistor in a semiconductor device includes forming device isolation structures in a substrate to define an active region. An oxide-based layer and a nitride-based layer are then formed between the active region and the device isolation structures. A predetermined gate region is etched in the active region to form a recess region. The damage layers are formed by a tilted ion implantation process using neutral elements on portions of the oxide-based layer exposed at the sidewalls of the recess region and other portions of the oxide-based layer below the recess region. The damage layers are then removed, thus causing a portion of the active region exposed at the bottom of the recess region to protrude.

6 Claims, 8 Drawing Sheets

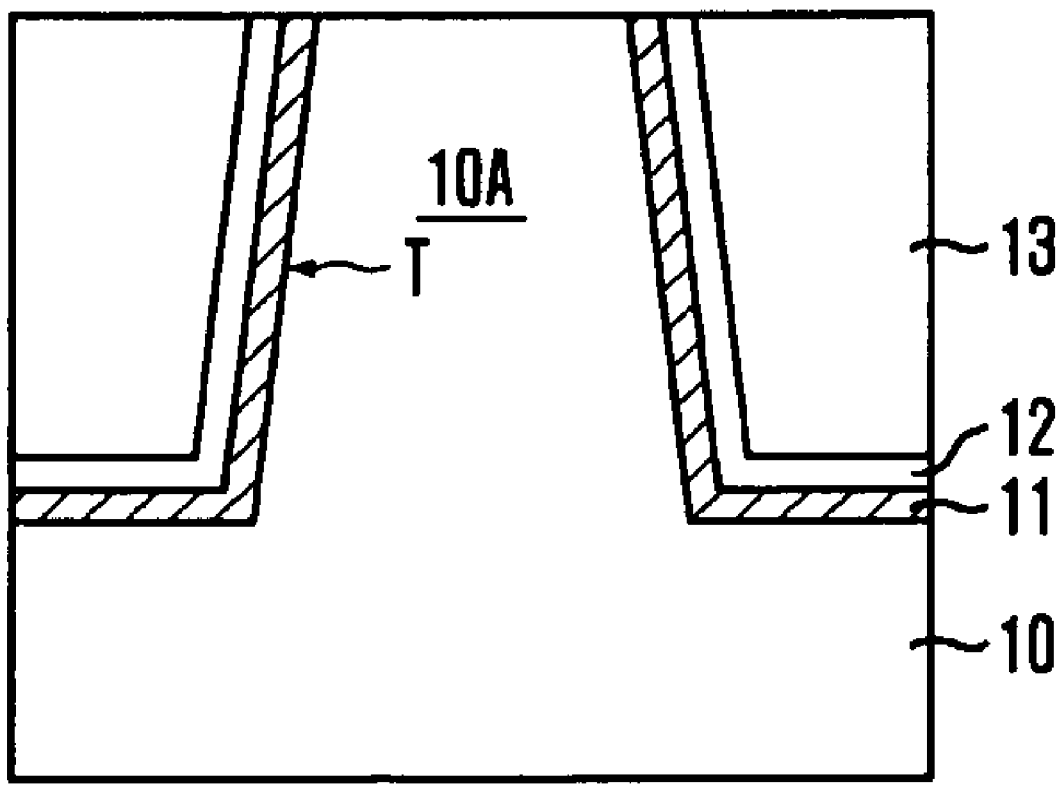

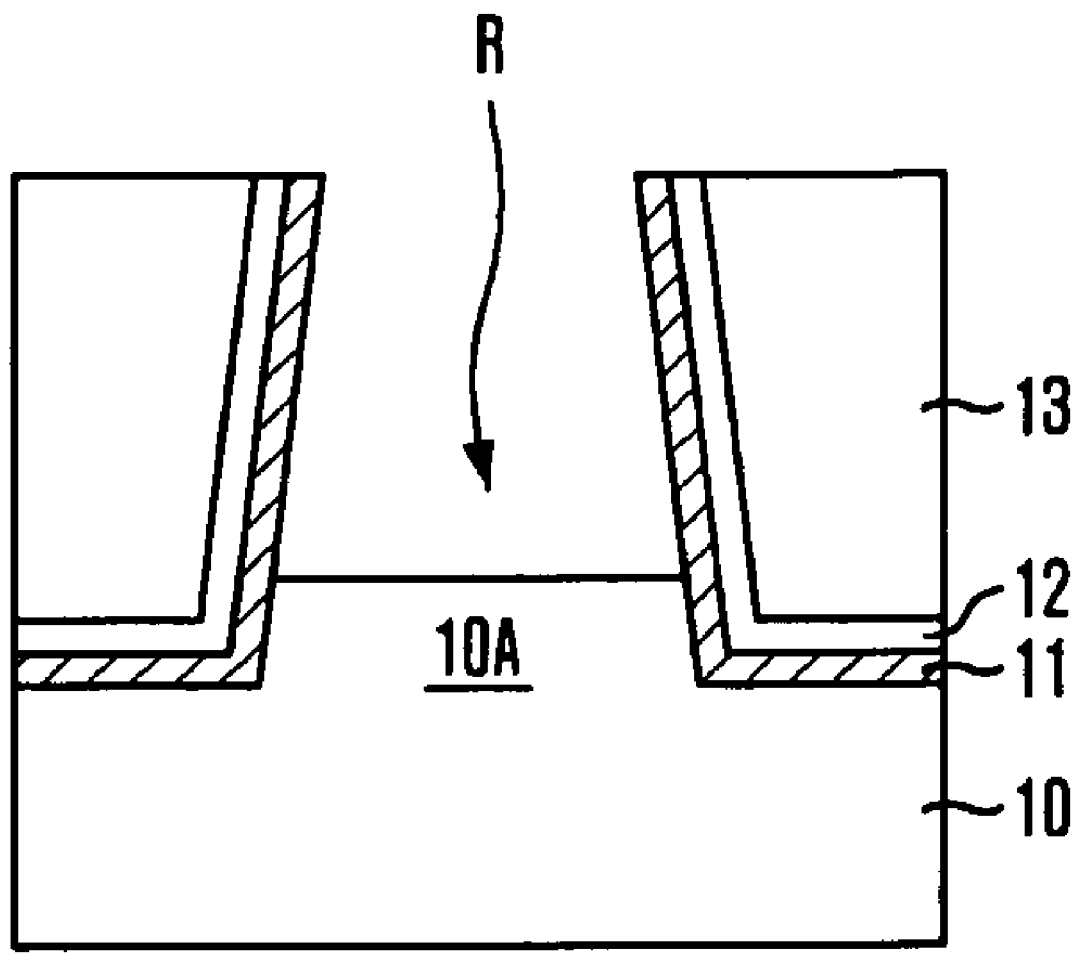

METHOD OF FORMING TRANSISTOR IN SEMICONDUCTOR DEVICE

CROSS-REFERENCE TO RELATED APPLICATIONS

The present disclosure claims priority of Korean patent application number 10-2008-0086294, filed on Sep. 2, 2008, which is incorporated herein by reference in its entirety.

BACKGROUND

One or more embodiments relate to a method of fabricating a semiconductor device, specifically, to a method of forming a transistor in a semiconductor device.

Recently, as semiconductor devices become more highly integrated, a method of utilizing a transistor including a recess gate to increase the size of channels and data retention time has been introduced to replace known planar type transistors.

Yet, as semiconductor devices become even more highly integrated, the on/off characteristic of a transistor begins to deteriorate. Thus, it is increasingly difficult to satisfy the desired characteristics of such transistors even if the recess gate is utilized.

To overcome such limitations, a US published patent application numbered 2008-0010885 illustrates a method of forming an active region in a fin type structure. This is done by, first, etching a recess gate and then wet etching an oxide-based layer exposed at the sidewalls of the recess. However, if the oxide-based layer is wet etched when a spacing distance between gates is very narrow, bridging between the gates may occur due to the isotropic etching characteristic of the wet etching process.

SUMMARY

One or more embodiments are directed to a method of forming a transistor in a semiconductor device, which can prevent bridges from occurring between gates and avoid threshold voltage fluctuation in a transistor generally caused by a tilted ion implantation process. The method includes, before removing an oxide-based layer exposed on sidewalls of a recess region, performing the tilted ion implantation process using neutral elements to form a damage layer on the oxide-based layer, controlling portions of the oxide-based layer to be removed.

One or more embodiments are directed to a method of forming a transistor in a semiconductor device, including: forming device isolation structures in a substrate to define an active region, wherein an oxide-based layer and a nitride-based layer are formed between the active region and the device isolation structures; etching a region predetermined for a gate in the active region to form a recess region; performing a tilted ion implantation process using neutral elements on portions of the oxide-based layer exposed on sidewalls of the recess region and other portions of the oxide-based layer below the recess region to form damage layers; and removing the damage layers to protrude a portion of the active region exposed at the bottom of the recess region.

Other objects and advantages of the embodiments can be understood by the following description, and will become apparent, hereafter.

DESCRIPTION OF EMBODIMENTS

One or more embodiments relate to a method of forming a transistor in a semiconductor device. The method includes forming a damage layer on an oxide-based layer by performing a tilted ion implantation process using neutral elements. This provides control over which portions of the oxide-based layer will be removed. Then, the oxide-based layer exposed at the sidewalls of a recess region is removed. Thus, bridging between gates may be prevented and threshold voltage fluctuation, generally caused by the tilted ion implantation process, may be avoided in a transistor.

FIGS. 1A to 4C illustrate a method of forming a transistor in a semiconductor device of one embodiment. FIGS. 1A, 2A, 3A and 4A illustrate top views of the transistor in the semiconductor device, FIGS. 1B, 2B, 3B and 4B illustrate cross-sectional views taken along a line X-X' of the transistor shown in FIGS. 1A, 2A, 3A and 4A, and FIGS. 1C, 2C, 3C and 4C illustrate cross-sectional views taken along a line Y-Y' of the transistor shown in FIGS. 1A, 2A, 3A and 4A.

Figure 1A:
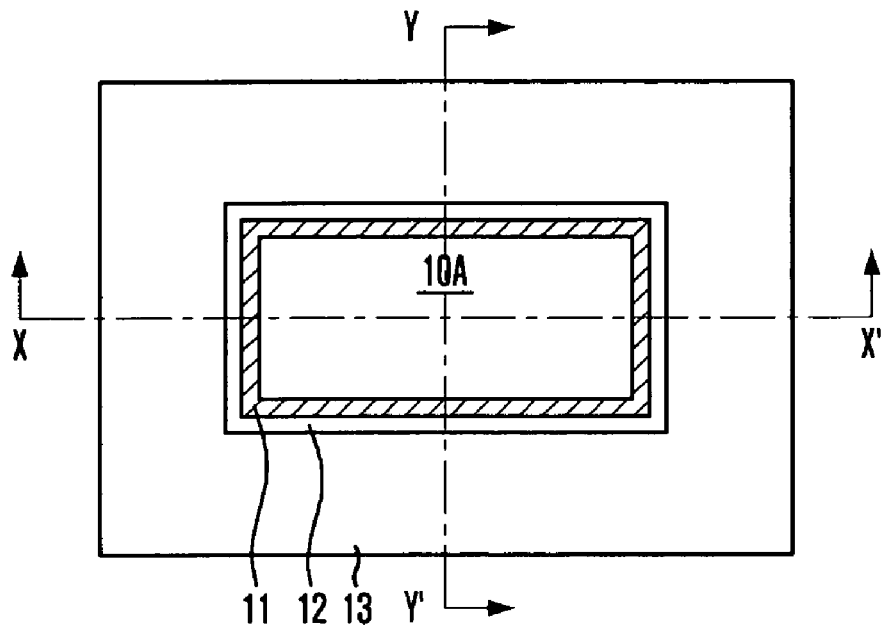
FIGS. 1A to 4C illustrate a method of forming a transistor in a semiconductor device of one embodiment.
Figure 1B:
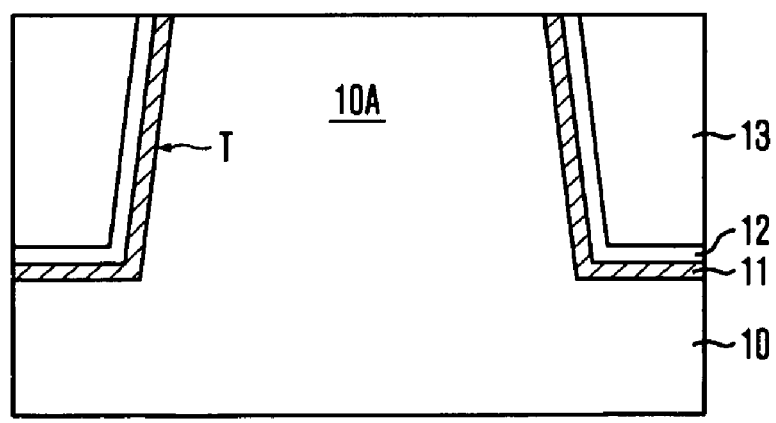

Referring to FIGS. 1A to 1C, a shallow trench isolation (STI) process is performed on a substrate 10 to form device isolation structures 13, thus, defining an active region 10A. More specifically, device isolation regions of the substrate 10 are selectively etched to form the device isolation trenches T. An oxide-based layer and a nitride-based layer are formed over the resultant substrate structure. An insulation layer, which is then formed over the resultant substrate structure, may include a high density plasma (HDP) oxide layer. The resultant substrate structure is then planarized until the active region 10A is exposed.

Consequently, the device isolation structures 13 are buried in the device isolation trenches T. Also, an oxide-based pattern 11 and a nitride-based pattern 12 are formed within the device isolation structures 13 and the active region 10A.

Figure 2A:
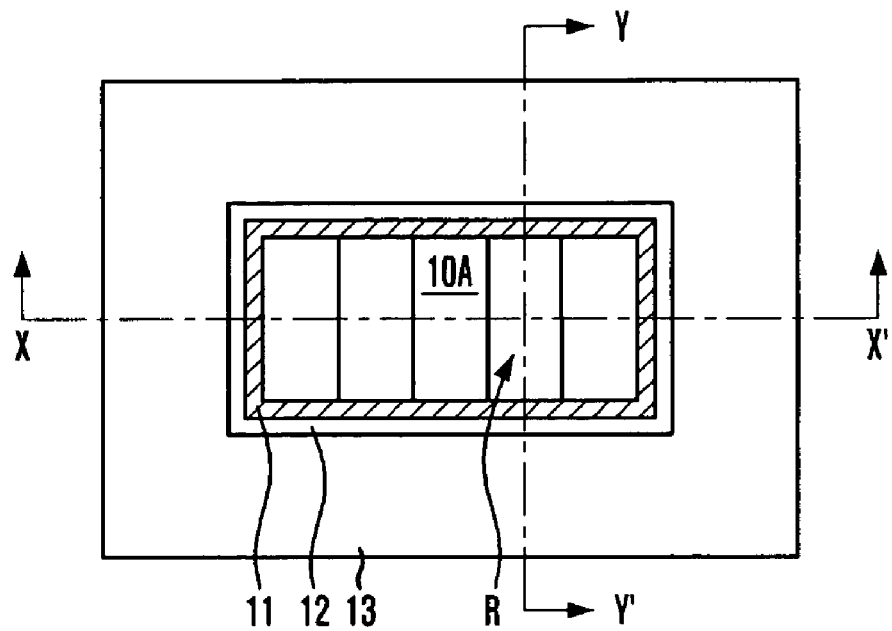
Figure 2B:
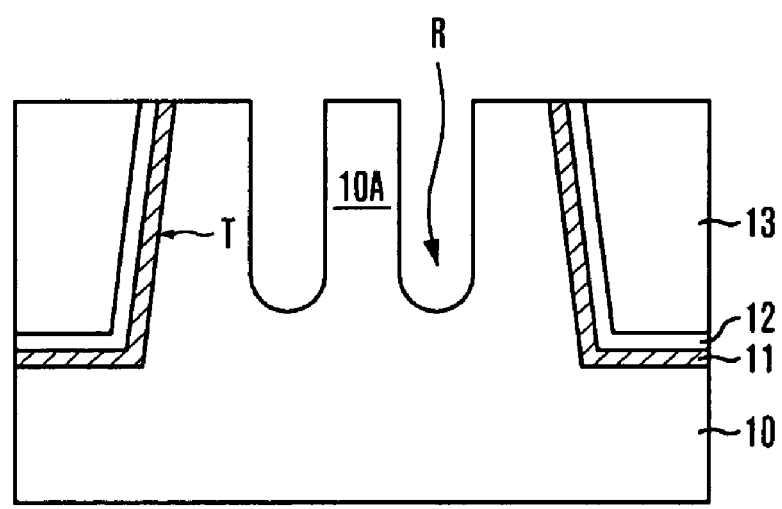

Referring to FIGS. 2A to 2C, recess regions R are formed defining the regions for formation of subsequent recess gates. The recess regions R are formed by etching certain regions of the active region 10A to a certain depth. It should be noted that the shape of the recess regions R, shown in the drawings, is not intended to be limiting. Alternatively, the recess regions R may be formed to have a bulb type structure.

Figure 3A:
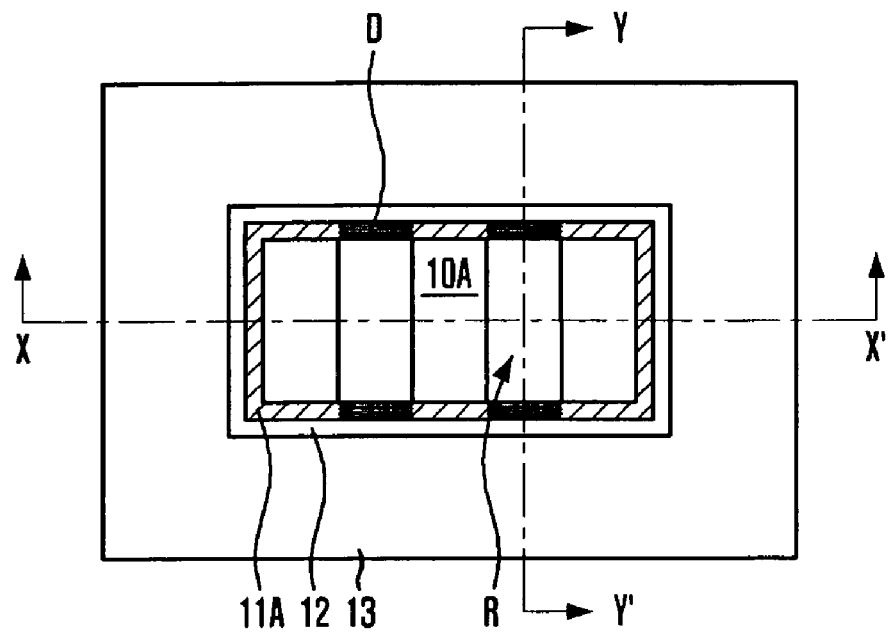
Figure 3B:
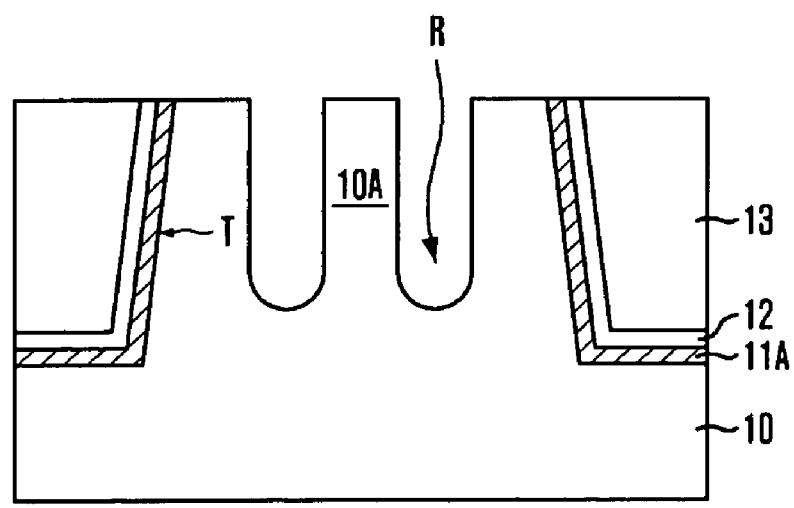
Figure 3C:
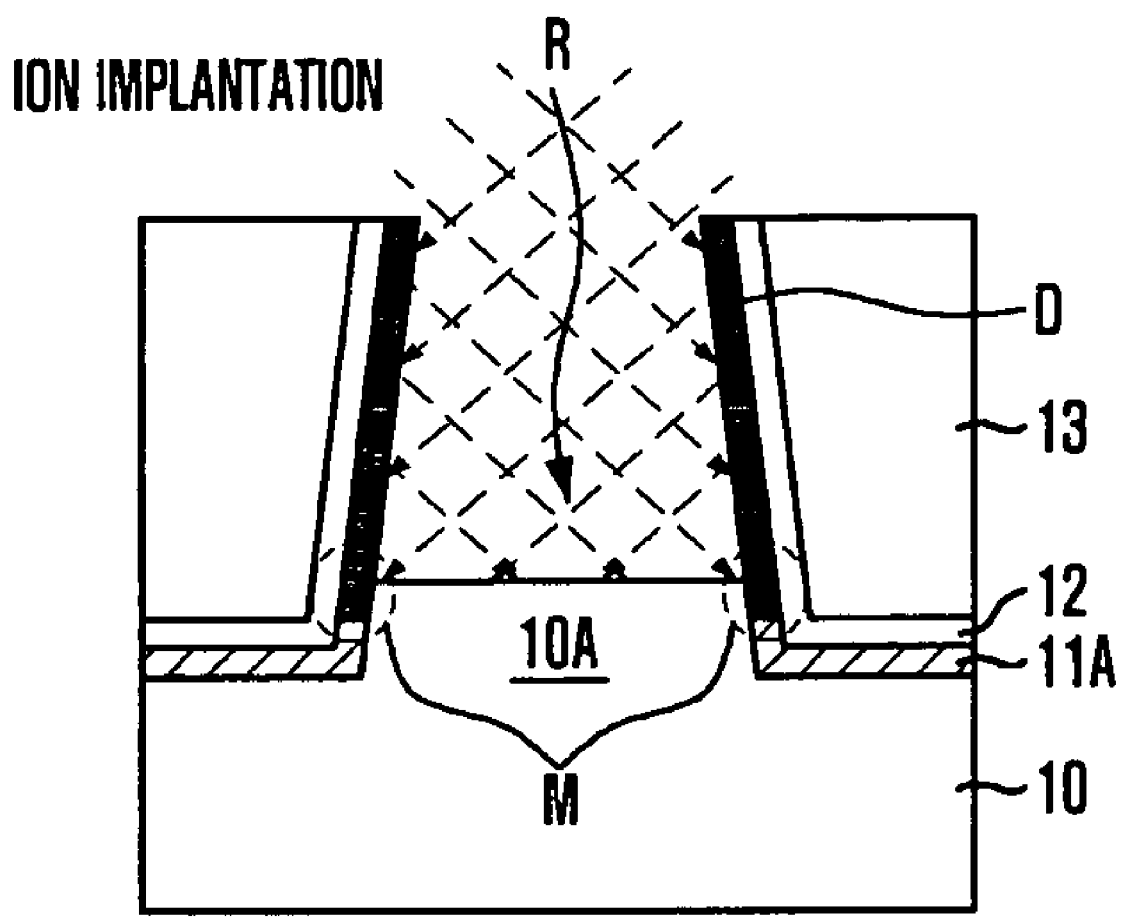

Referring to FIGS. 3A to 3C, a tilted ion implantation process is performed on portions of the oxide-based pattern 11 exposed through formation of the recess regions R, thus, forming the damage layers D. Reference denotation 11A represents the remaining oxide-based pattern.

Unlike in known methods of fabrication, the damage layers D are formed prior to wet etching the oxide-based pattern 11. The damage layers D have a greater wet etch rate than the oxide-based pattern 11. Thus, they will be wet etched away faster than the oxide-based pattern 11, thereby creating the recesses. In other words, forming the damage layers D provides control over which portions of the oxide-based pattern 11 will be removed. Thus, bridging between gates can be prevented.

Furthermore, the ion implantation process is performed using neutral elements such as argon (Ar). Generally, when performing a tilted ion implantation process, ion implanted dopants scatter throughout the transistor, penetrating into channel regions. If the dopants are not neutral elements, e.g. difluoroboryl radical ($BF_2$), then the transistor's threshold voltage may fluctuate based on the electrical characteristics of the dopants.

This limitation may be overcome by adequately controlling the dose of dopants being ion implanted, however, there is much to consider when controlling the dose of dopants, such as the angle of tilted ion implantation process, the depth of recess, and the width of recess. Therefore, the tilted ion implantation process uses neutral elements so that even if the dopants scatter throughout the transistor, penetrating into the channel regions, the transistor's threshold voltage may not be affected.

Also, such tilted ion implantation process is performed in a manner that the damage layers D include not only the portions of the oxide-based pattern 11 exposed by the formation of the recess regions R but also certain portions of the oxide-based pattern 11 formed below the recess regions R. Such portions are referred to as moat regions M.

Figure 4A:
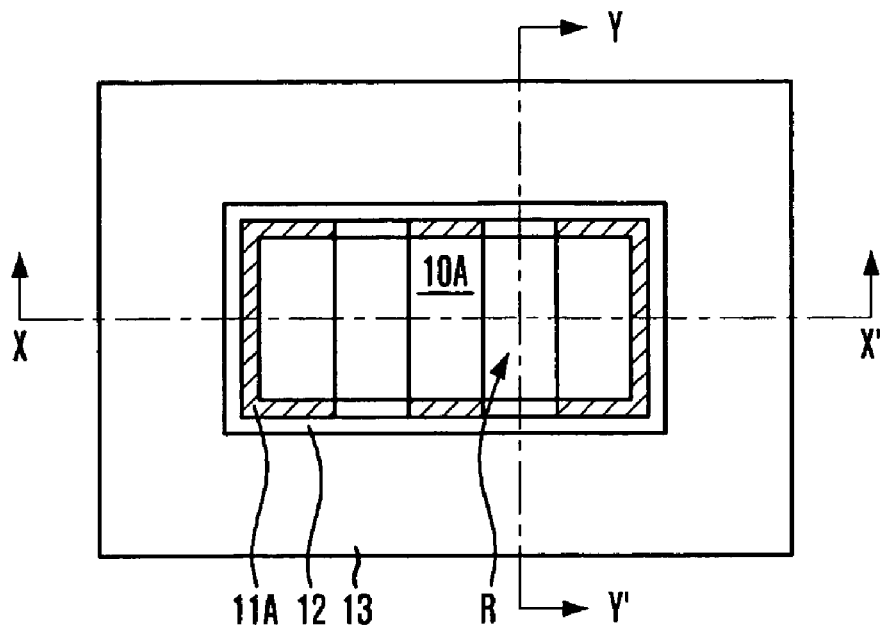
Figure 4B:
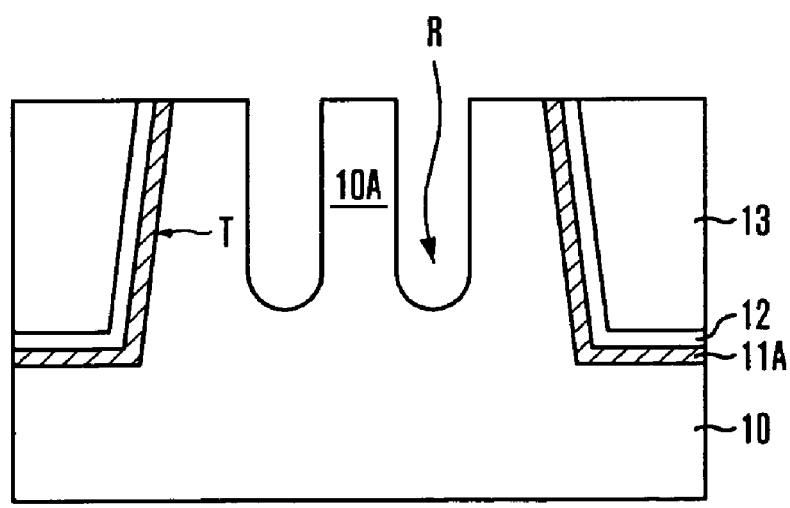
Figure 4C:
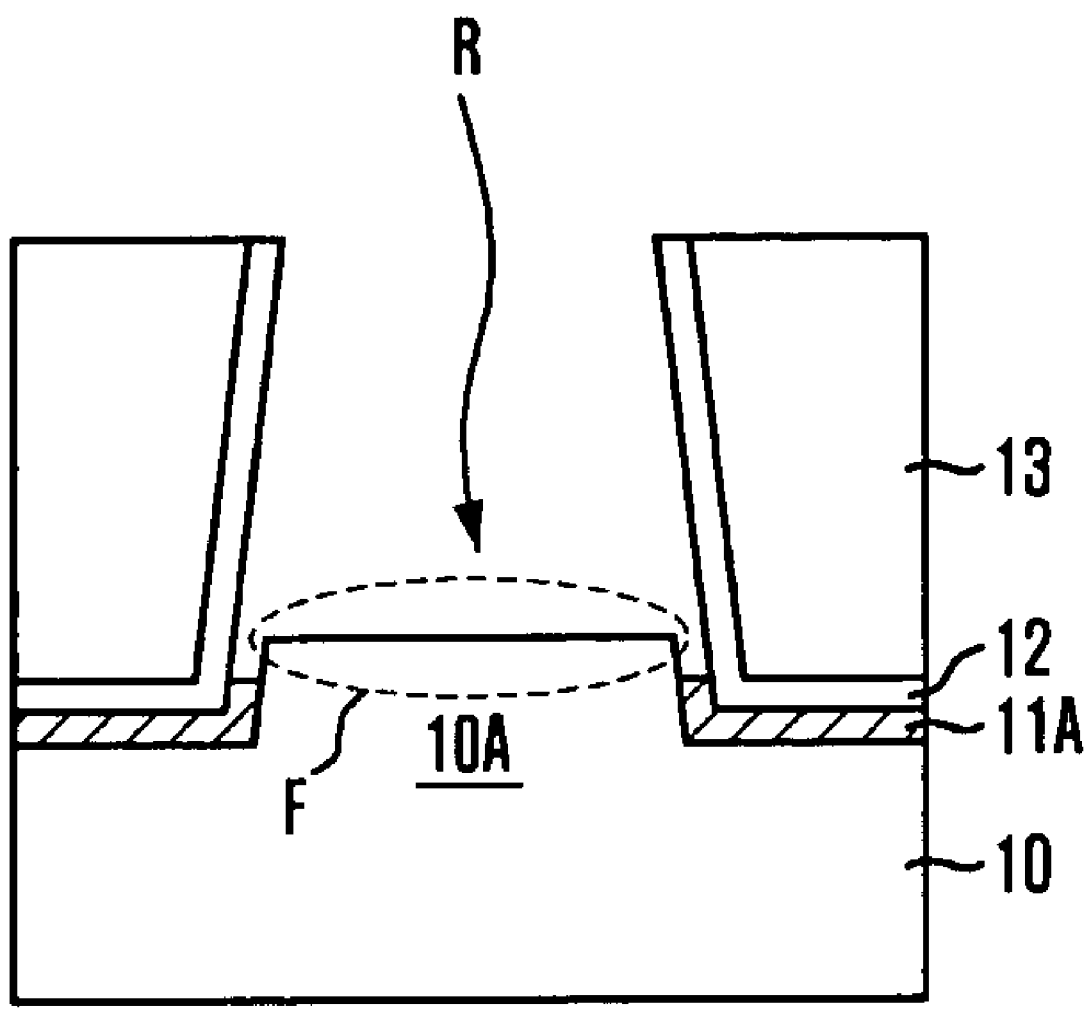

Referring to FIGS. 4A to 4C, a wet etching process is performed to remove the portions of the oxide-based pattern 11 exposed by the formation of the recess regions R, that is the damage layers D. The damage layers D are more likely to be removed than the remaining oxide-based pattern 11A during the wet etching process because the damage layers D have a greater wet etch rate than the remaining oxide-based pattern 11A. Thus, because the portions to be removed while performing the wet etching process may be controlled, bridging between subsequent gates may be prevented.

Meanwhile, portions of the damage layers D extend below the recess regions R. Through the wet etching process, these damage layers D are removed, creating the moat regions M. Consequently, as displayed in FIG. 4C, the active region 10A at the bottom of the recess regions R protrudes in a fin type structure F. Because the active region 10A is formed having a fin type structure, the size of channel regions may be increased beyond that of the recess gates of known transistors. Although not illustrated, a conductive layer is buried in the recess regions R to form gates.

While the embodiments have been described, it will be apparent to those skilled in the art that various changes and modifications may be made.

What is claimed is:

1. A method of forming a transistor in a semiconductor device, comprising:
    forming an oxide-based layer and a nitride-based layer over a substrate;
    forming a device isolation structure over the substrate to define an active region, wherein the oxide-based layer and the nitride-based layer are formed between the active region and the device isolation structure;
    after the forming of the oxide-based layer and the nitride-based layer, etching a predetermined gate region in the active region to form a recess region and to expose portions of the oxide-based layer at sidewalls of the recess region;
    performing a tilted ion implantation process, using at least a neutral element, on the exposed portions of the oxide-based layer and extended portions of the oxide-based layer that extends from the exposed portions and below the recess region to form damage layers; and
    removing the damage layers causing a portion of the active region exposed at the bottom of the recess region to form a fin type structure.

2. The method of claim 1, wherein the neutral element includes argon (Ar).

3. The method of claim 1, wherein a wet etching process is used for removing the damage layers.

4. The method of claim 1, wherein the forming an oxide-based layer and a nitride-based layer and the forming the device isolation structure comprise:
    etching device isolation regions in the substrate to form trenches;
    forming the oxide-based layer and the nitride-based layer over the trenches;
    forming an insulation layer over the trenches; and
    planarizing the resultant substrate structure until the active region is exposed.

5. The method of claim 1, further comprising, after the damage layers are removed, forming a conductive layer buried in the recess region.

6. The method of claim 1, wherein the forming the oxide-based layer and the nitride-based layer and the forming the device isolation structure comprise:
    etching a device isolation region in the substrate to form a trench;
    forming the oxide-based layer and the nitride-based layer over the trench;
    forming an insulation layer over the trench; and
    planarizing the insulation layer, the oxide-based layer, or the nitride-based layer until the active region is exposed.

* * * * *